United States Patent [19]

Debesis

[11] 3,871,008

[45] Mar. 11, 1975

[54] REFLECTIVE MULTIPLE CONTACT FOR SEMICONDUCTOR LIGHT CONVERSION ELEMENTS

[75] Inventor: John R. Debesis, Richmond Heights, Ohio

[73] Assignee: General Electric Company, Schenectady, N.Y.

[22] Filed: Dec. 26, 1973

[21] Appl. No.: 427,935

[52] U.S. Cl. ........................ 357/65, 357/17, 357/67, 357/68, 357/81

[51] Int. Cl. ............................ H01l 3/00, H01l 5/00

[58] Field of Search ........ 317/234 A, 234 G, 234 L, 317/234 J, 235

[56] References Cited

UNITED STATES PATENTS

| | | | |
|---|---|---|---|
| 3,058,041 | 10/1962 | Happ | 317/234 G |
| 3,255,393 | 6/1966 | Hutchins et al. | 317/235 UZ |
| 3,332,867 | 7/1967 | Miller et al. | 317/234 A |
| 3,386,867 | 6/1968 | Staples | 317/234 J |
| 3,448,349 | 6/1969 | Sumner | 317/235 UA |
| 3,684,930 | 8/1972 | Collins et al. | 317/234 L |
| 3,728,785 | 4/1973 | Schmidt | 317/234 L |

*Primary Examiner*—Andrew J. James
*Attorney, Agent, or Firm*—Norman C. Fulmer; Lawrence R. Kempton; Frank L. Neuhauser

[57] ABSTRACT

A plurality of individual raised metal contact areas are distributed over and attached to a surface of a semiconductor light conversion element such as a gallium phosphide light-emitting diode. The outer tips of at least some of the raised contact areas are bonded to an electrical contact member, thereby providing an air boundary over a substantial portion of said semiconductor surface and thus causing considerable internal light reflection.

4 Claims, 3 Drawing Figures

REFLECTIVE MULTIPLE CONTACT FOR SEMICONDUCTOR LIGHT CONVERSION ELEMENTS

CROSS-REFERENCES TO RELATED APPLICATIONS

Ser. No. 427,803, John R. Debesis, "Method of Making Contacts to Semiconductor Light Conversion Elements," filed concurrently herewith and assigned the same as this invention.

Ser. No. 427,936, John R. Debesis, "Reflective Coated Multiple Contact for Semiconductor Light Conversion Elements," filed concurrently herewith and assigned the same as this invention.

BACKGROUND OF THE INVENTION

The invention is in the field of solid state light conversion devices employing light-emitting diodes or light-sensitive diodes and functioning in the infrared or visible light spectrum. In solid state lamps, the light-emitting diode is made from a flat "chip" of material, such as gallium arsenide, gallium phosphide, or silicon carbide, suitably doped with dopant material so as to form a p-n junction which emits light (visible or infrared) when current is passed therethrough. The p-n junction is between and parallel to the "top" and "bottom" surfaces of the diode, it being assumed for convenience that the light to be utilized is that which emerges through the top surface. Of the light emitted by the p-n junction, only a small amount exits through the top surface of the diode, due to the effect of the "critical angle" caused by the high index of refraction of the diode material whereby only the light rays approaching the top surface perpendicularly and approximately perpendicularly can pass through the surface and become usefully emitted light, whereas the remaining majority of light rays are internally reflected at the top surface.

The amount of light emitted through the top surface of the diode can be increased by encapsulating the top surface of the diode with material having a refractive index greater than unity, i.e. greater than that of air, thereby increasing the critical angle whereby a greater amount of light exits through the top surface, as described in U.S. Pat. No. 3,676,668 to Collins, Kerber, and Neville. The aforesaid patent also discloses a way of increasing the amount of emitted light by mounting the bottom of the diode on a mechanical support and electrical contact member in a manner so that a major portion of the bottom surface is bounded by air or other low optical refractive index material so as to reduce the critcal angle and hence increase internal reflection at the bottom surface, thereby increasing the amount of light emitted upwardly through the top surface of the diode.

SUMMARY OF THE INVENTION

Objects of the invention are to provide improved reflective contacts to semiconductor light conversion elements, which can be manufactured easily and at low cost, and to increase the efficiency and light output of such elements.

The invention comprises, briefly and in a preferred embodiment, a plurality of individual raised contact areas distributed over and attached to a surface of a semiconductor light conversion element, and means bonding the outer tips of at least some raised contact areas to an electrical contact member so that a major portion of said surface is free from contact with solid matter and is bounded by air, other gas, or vacuum, so as to reduce the critical angle and hence increase internal light reflection at said surface. The aforesaid bonding of the outer tips of the raised contact areas to the contact member can be achieved by heat-bonding, or by a thin layer of electrically conductive cement.

DESCRIPTION OF THE PREFERRED EMBODIMENTS

Figure 1:
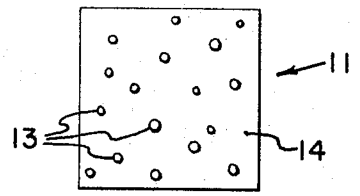
FIG. 1 is a top view of a p-n junction semiconductor light conversion element having distributed individual raised contact areas on a surface thereof.

A p-n junction semiconductor light conversion element 11, such as a light-emitting diode or a light-sensitive diode, has a p-n junction 12 therein substantially parallel to the top and bottom surfaces thereof. The element 11 may be made from suitably doped gallium arsenide, gallium phosphide, or other suitable materials. A plurality of raised individual low resistance electrical contact areas 13 are distributed over a surface 14 of the element 11. The contact areas 13 may be formed by applying a layer of metal over the semiconductor surface 14 and heating to a temperature such that the metal layer dissociates into the distributed raised areas 13 in the form of individual lumps of metal sintered to the semiconductor surface 14. For a n-doped gallium phosphide semiconductor, for example, a suitable metal for the aforesaid layer is a gold-12 weight percent germanium eutectic, which is temporarily heated to about 550° to 600°C for a time of about 2 to 5 minutes, in a reducing atmosphere, thereby causing the distributed raised areas 13 to form. Further details of this method are disclosed in the above-referenced patent application Ser. No. 427,803. Preferably, only a small amount (such as 5 percent) of the total area of the surface 14 is occupied by the metal contact areas 13, the remaining portion (such as 95 percent) of the surface area being free of metal.

Another method of forming the raised contact areas 13 is to place over the semiconductor surface 14 a mask having a plurality of openings through which metal is evaporated, sputtered, or otherwise built up on the surface 14 to form the raised contact areas 13; the mask is removed and the assembly is heated to sinter the metal raised areas onto the surface 14. The relative size of the contact areas 13 is exaggerated in the drawing, and may have maximum heights of about 0.01 mm, for example.

Figure 2:
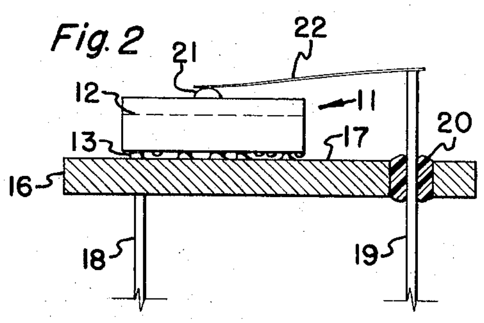
FIG. 2 is a side view of the light conversion element bonded onto a support and contact header, the tips of at least some of the distributed raised contact areas being alloyed onto the surface of the header.

The semiconductor element 11 is positioned on a conductor member such as a metal header 16, and the outermost tips of at least some of the raised contact areas are bonded to the surface 17 of the header. In the embodiment of FIG. 2, the tips or end regions of the contact areas are melted to the surface 17. The header 16 may comprise gold-plated Kovar. For raised contact areas of a gold-germanium eutectic as described above, the assembly may be heated to about 450°C for just enough time for the outer tips of some (i.e., the longer) raised contact areas to become molten and alloy with the gold plating of the header, thus providing good mechanical and electrical contact with the gold plating of the header 16. This leaves a major portion of the area of the bottom surface of the element 11 free of contact with solid matter and bounded by air, or other gas in the case of a gas-filled unit, or vacuum, which has the effect of greatly increasing internal light reflectivity at this bottom surface, as described more fully in the above-referenced patent, thereby increasing the amount of light desirably emitted through the top surface of the element 11. The distributed contact areas also desirably provide substantially uniform current density over the contact surface 14.

The construction is completed by providing a lead-in conductor 18 attached to the header 16, and a second lead-in conductor 19 extending through an opening in the header 16 and held in place and electrically insulated from the header by a glass or ceramic bead 20. A small dot electrical contact 21 is provided on the top surface of the element 11, and is connected by means of a fine wire 22 to the upper end of the lead-in wire 19, as described in the above-referenced patent. The structure may be encapsulated as described in the above-referenced patent, or may be provided with a cylindrical cap and lens described in U.S. Pat. No. 3,458,779, issued July 29, 1969 to Drs. Blank and Potter.

Figure 3:
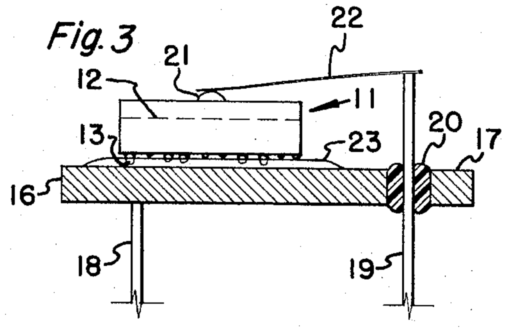
FIG. 3 is a side view of the light conversion element bonded to a header by an alternative means, the tips of at least some of the distributed raised contact areas being cemented to the header surface by a thin layer of electrically conductive cement.

In the embodiment of FIG. 3, the tips or end regions of at least some of the raised contact areas 13 (and particularly the longer ones) are bonded to the surface 17 of the header 16 by electrically conductive cement 23 such as conductive epoxy cement. This may be accomplished by applying a thin layer of the cement 23 to the header surface 17 and placing the element 11, with raised contact areas 13 extending downwardly, onto the layer of cement, taking care that the cement does not come into contact with the surface 14 of the semiconductor element 11. The element need not be pressed down to bring contact areas 13 into direct touching contact with the header surface 17. Preferably, no more than about half of the height of the longer contact areas 13 are embedded in the cement 23.

While preferred embodiments and modifications of the invention have been shown and described, other embodiments and modifications will become apparent to persons skilled in the art and will be within the scope of the invention as defined in the following claims.

What I claim as new and desire to secure by Letters Patent of the United States is:

1. A contact construction for attaching a solid state light conversion element to a conductor member, comprising a plurality of individual raised electrical contact areas distributed over and attached to a surface of said light conversion element, said element being positioned with said surface adjacent to a surface of said conductor member, and bonding means attaching the outer tips of at least some of said raised contact areas to said surface of the conductor member and providing electrical connection therebetween, a major portion of said surface of the light conversion element being free from contact with solid matter.

2. A construction as claimed in claim 1 in which said bonding means comprises said outer tips of at least some of the raised contact areas being in melted contact with said surface of the conductor member.

3. A construction as claimed in claim 2 in which said light conversion element comprises gallium phosphide, said raised contact areas comprise a gold-germanium eutectic, and said surface of the conductor member comprises gold.

4. A construction as claimed in claim 1 in which said bonding means comprises electrically conductive cement.

* * * * *